US010756168B2

(12) United States Patent
Hiyoshi

(10) Patent No.: US 10,756,168 B2
(45) Date of Patent: Aug. 25, 2020

(54) SILICON CARBIDE SEMICONDUCTOR DEVICE

(71) Applicant: Sumitomo Electric Industries, Ltd., Osaka-shi (JP)

(72) Inventor: Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 46 days.

(21) Appl. No.: 16/089,448

(22) PCT Filed: Feb. 2, 2017

(86) PCT No.: PCT/JP2017/003712
§ 371 (c)(1),
(2) Date: Sep. 28, 2018

(87) PCT Pub. No.: WO2017/169085
PCT Pub. Date: Oct. 5, 2017

(65) Prior Publication Data
US 2019/0237536 A1    Aug. 1, 2019

(30) Foreign Application Priority Data

Mar. 31, 2016 (JP) ................................. 2016-071217

(51) Int. Cl.
*H01L 29/06* (2006.01)
*H01L 29/16* (2006.01)
(Continued)

(52) U.S. Cl.
CPC ........ *H01L 29/063* (2013.01); *H01L 29/1095* (2013.01); *H01L 29/12* (2013.01);
(Continued)

(58) Field of Classification Search
None
See application file for complete search history.

(56) References Cited

U.S. PATENT DOCUMENTS 9,954,054 B2 *  4/2018  Shiomi ................. H01L 21/046
2013/0285140 A1  10/2013  Kagawa et al.
2017/0141186 A1   5/2017  Shiomi

FOREIGN PATENT DOCUMENTS

JP     2009-117593 A    5/2009
JP     2011-100967 A    5/2011
(Continued)

*Primary Examiner* — Robert K Carpenter
(74) *Attorney, Agent, or Firm* — Baker Botts L.L.P.; Michael A. Sartori

(57) ABSTRACT

A silicon carbide semiconductor device includes: a silicon carbide substrate; a first silicon carbide layer disposed on the silicon carbide substrate; a second silicon carbide layer disposed on the first silicon carbide layer; a third silicon carbide layer disposed on the second silicon carbide layer; a fourth silicon carbide layer disposed on the third silicon carbide layer; and a first impurity region formed to extend through the second silicon carbide layer, the third silicon carbide layer and the fourth silicon carbide layer. A trench is formed in the silicon carbide semiconductor device. The silicon carbide semiconductor device includes: a gate insulating film in contact with a wall of the trench; a gate electrode; a second impurity region disposed below the trench; a third impurity region formed below the first impurity region; and a fourth impurity region formed between the second impurity region and the third impurity region.

18 Claims, 9 Drawing Sheets

(51) Int. Cl.
  *H01L 29/10*     (2006.01)
  *H01L 29/423*    (2006.01)
  *H01L 29/739*    (2006.01)
  *H01L 29/78*     (2006.01)
  *H01L 29/12*     (2006.01)

(52) U.S. Cl.
  CPC ...... *H01L 29/1608* (2013.01); *H01L 29/4236* (2013.01); *H01L 29/42368* (2013.01); *H01L 29/739* (2013.01); *H01L 29/7397* (2013.01); *H01L 29/7813* (2013.01)

(56) References Cited

FOREIGN PATENT DOCUMENTS

| | | |
|---|---|---|
| JP | 2012-038770 A | 2/2012 |
| JP | 2012-099601 A | 5/2012 |
| JP | 2013-069964 A | 4/2013 |
| JP | 2013-145770 A | 7/2013 |
| JP | 2013-219161 A | 10/2013 |
| JP | 2014-041990 A | 3/2014 |
| JP | 2014-053595 A | 3/2014 |
| JP | 2015-026726 A | 2/2015 |
| JP | 2015-220408 A | 12/2015 |
| WO | 2012/077617 A1 | 6/2012 |
| WO | 2016/002766 A1 | 1/2016 |
| WO | 2016/038833 A1 | 3/2016 |

\* cited by examiner

SILICON CARBIDE SEMICONDUCTOR DEVICE

TECHNICAL FIELD

The present disclosure relates to silicon carbide semiconductor devices. The present application claims priority to Japanese Patent Application No. 2016-071217 filed on Mar. 31, 2016, the entire contents of which are incorporated herein by reference.

BACKGROUND ART

WO 2012/077617 (PTD 1), and Japanese Patent Laying-Open Nos. 2012-99601 (PTD 2) and 2013-69964 (PTD 3), for example, each disclose a silicon carbide semiconductor device including a p type diffusion layer formed in a lower portion of a trench.

Japanese Patent Laying-Open No. 2013-145770 (PTD 4) discloses a silicon carbide semiconductor device having a deep p type region formed in a source region. Japanese Patent Laying-Open No. 2014-41990 (PTD 5) discloses a silicon carbide semiconductor device having a buried p type region.

CITATION LIST

Patent Documents

PTD 1: WO 2012/077617
PTD 2: Japanese Patent Laying-Open No. 2012-99601
PTD 3: Japanese Patent Laying-Open No. 2013-69964
PTD 4: Japanese Patent Laying-Open No. 2013-145770
PTD 5: Japanese Patent Laying-Open No. 2014-41990

SUMMARY OF INVENTION

A silicon carbide semiconductor device according to one embodiment of the present disclosure includes a silicon carbide substrate, a first silicon carbide layer, a second silicon carbide layer, a third silicon carbide layer, a fourth silicon carbide layer, and a first impurity region. The first silicon carbide layer is disposed on the silicon carbide substrate and has a first conductivity type. The second silicon carbide layer is disposed on the first silicon carbide layer and has the first conductivity type. The third silicon carbide layer is disposed on the second silicon carbide layer and has a second conductivity type different from the first conductivity type. The fourth silicon carbide layer is disposed on the third silicon carbide layer and has the first conductivity type. The first impurity region is formed to extend through the second silicon carbide layer, the third silicon carbide layer and the fourth silicon carbide layer, and has the second conductivity type. A trench is formed in the silicon carbide semiconductor device so as to extend through the fourth silicon carbide layer and the third silicon carbide layer to reach the second silicon carbide layer. The silicon carbide semiconductor device includes a gate insulating film in contact with a wall of the trench, a gate electrode, a second impurity region, a third impurity region, and a fourth impurity region. The gate electrode is in contact with the gate insulating film and fills the trench. The second impurity region is disposed below the trench while being spaced from a bottom of the trench, and has the second conductivity type. The third impurity region is formed below the first impurity region so as to be in contact with the first impurity region, has the second conductivity type, and is electrically connected to the second impurity region. The fourth impurity region is formed between the second impurity region and the third impurity region and has the first conductivity type.

BRIEF DESCRIPTION OF DRAWINGS

FIG. 2 illustrates operation when the silicon carbide semiconductor device according to the embodiment of the present disclosure is on.

FIG. 7 is a partial enlarged view illustrating a current which flows when the silicon carbide semiconductor device according to the embodiment of the present disclosure is on.

DETAILED DESCRIPTION

Figure 1:
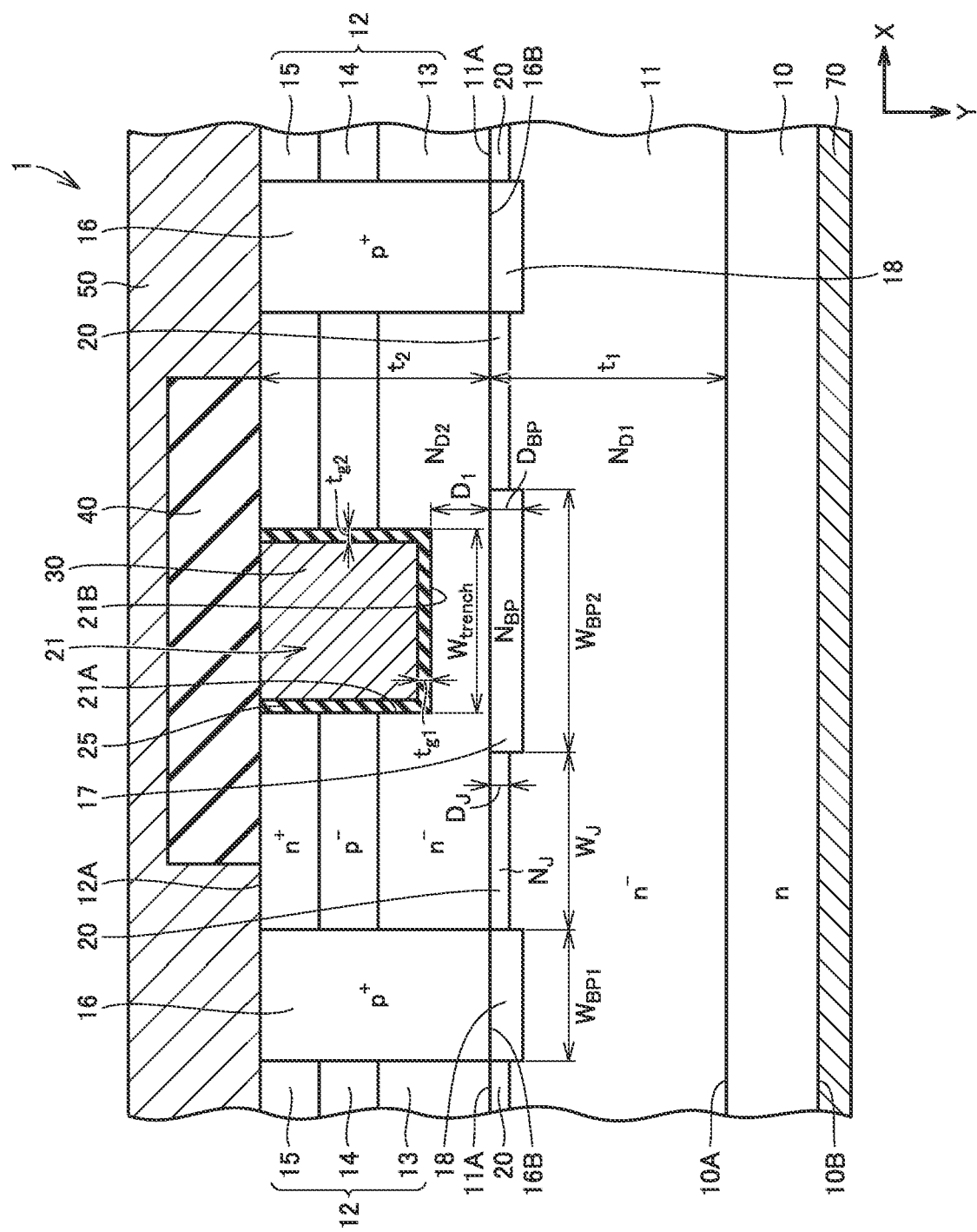
FIG. 1 is a cross-sectional view showing the structure of a silicon carbide semiconductor device according to one embodiment of the present disclosure.

Problem to be Solved by the Present Disclosure

In the silicon carbide semiconductor devices disclosed in PTDs 1 to 3, a p type region is disposed at the bottom of a trench. In such a structure, however, constriction resistance tends to occur between the p type region and a p type body region. A high resistance value of the constriction resistance causes an increase in on resistance of the silicon carbide semiconductor device.

When avalanche breakdown occurs in the p type region, a large current may flow through a gate insulating film to a trench gate. That is, avalanche breakdown may cause damage to the gate insulating film.

An object of the present disclosure is to provide a silicon carbide semiconductor device in which the possibility of damage to a gate insulating film upon occurrence of avalanche breakdown can be reduced, without an increase in on resistance.

Advantageous Effect of the Present Disclosure

According to the present disclosure, a silicon carbide semiconductor device can be implemented in which the possibility of breakage of a gate insulating film during avalanche breakdown can be reduced, without an increase in on resistance.

Description of Embodiment of the Present Disclosure

An embodiment of the present disclosure will be described below with reference to the drawings. In the following description, the same or corresponding elements are designated by the same symbols and detailed description thereof will not be repeated.

Regarding crystallographic denotation herein, an individual orientation, a group orientation, an individual plane, and a group plane are shown in [ ], < >, ( ) and { }, respectively. Although a crystallographically negative index is normally expressed by a number with a bar "-" thereabove, a negative sign herein precedes a number to indicate a crystallographically negative index. In expressing an angle, a system in which a total azimuth angle is defined as 360 degrees is employed.

First, the embodiment of the present disclosure will be listed and described.

(1) A silicon carbide semiconductor device (1) according to one embodiment of the present disclosure includes a silicon carbide substrate (10), a first silicon carbide layer (11), a second silicon carbide layer (13), a third silicon carbide layer (14), a fourth silicon carbide layer (15), and a first impurity region (16). The first silicon carbide layer (11) is disposed on the silicon carbide substrate (10) and has a first conductivity type. The second silicon carbide layer (13) is disposed on the first silicon carbide layer (11) and has the first conductivity type. The third silicon carbide layer (14) is disposed on the second silicon carbide layer (13) and has a second conductivity type different from the first conductivity type. The fourth silicon carbide layer (15) is disposed on the third silicon carbide layer (14) and has the first conductivity type. The first impurity region (16) is formed to extend through the second silicon carbide layer (13), the third silicon carbide layer (14) and the fourth silicon carbide layer (15), and has the second conductivity type. A trench (21) is formed in the silicon carbide semiconductor device (1) so as to extend through the fourth silicon carbide layer (15) and the third silicon carbide layer (14) to reach the second silicon carbide layer (13). The silicon carbide semiconductor device (1) includes a gate insulating film (25) in contact with a wall of the trench (21), a gate electrode (30), a second impurity region (17), a third impurity region (18), and a fourth impurity region (20). The gate electrode (30) is in contact with the gate insulating film (25) and fills the trench (21). The second impurity region (17) is disposed below the trench (21) while being spaced from a bottom of the trench (21), and has the second conductivity type. The third impurity region (18) is formed below the first impurity region (16) so as to be in contact with the first impurity region (16), has the second conductivity type, and is electrically connected to the second impurity region (17). The fourth impurity region (20) is formed between the second impurity region (17) and the third impurity region (18) and has the first conductivity type.

According to the above, a silicon carbide semiconductor device can be implemented in which the possibility of breakage of a gate insulating film during avalanche breakdown can be reduced, without an increase in on resistance. The second impurity region is disposed below the trench while being spaced from the bottom of the trench. Therefore, an increase in on resistance due to constriction resistance can be suppressed. Furthermore, the possibility of occurrence of a current flowing through the gate insulating film can be reduced even when avalanche breakdown occurs. Therefore, the possibility of breakage of the gate insulating film can be reduced.

(2) In the silicon carbide semiconductor device of (1) described above, an impurity concentration ($N_{D2}$) of the second silicon carbide layer (13) is higher than an impurity concentration ($N_{D1}$) of the first silicon carbide layer (11). An impurity concentration ($N_J$) of the fourth impurity region (20) is higher than the impurity concentration ($N_{D2}$) of the second silicon carbide layer (13). An impurity concentration ($N_{BP}$) of the second impurity region (17) is higher than the impurity concentration ($N_J$) of the fourth impurity region (20).

Since the impurity concentration of the second silicon carbide layer is higher than the impurity concentration of the first silicon carbide layer, the on resistance of the silicon carbide semiconductor device can be reduced. Furthermore, since the impurity concentration of the fourth impurity region is higher than the impurity concentration of the second silicon carbide layer, the on resistance of the silicon carbide semiconductor device can be reduced. The impurity concentration of the second impurity region is higher than the impurity concentration of the fourth impurity region. Accordingly, the second impurity region is less likely to be completely depleted even when a reverse bias voltage of prescribed magnitude is applied to a drain electrode of the silicon carbide semiconductor device. An electric field applied to the gate insulating film can be relieved, so that the possibility of breakage of the gate insulating film can be reduced.

(3) In the silicon carbide semiconductor device of (1) or (2) described above, a depth ($D_J$) of the fourth impurity region (20) from an interface (11A) between the first silicon carbide layer (11) and the second silicon carbide layer (13) is smaller than a depth ($D_{BP}$) of the second impurity region (17) from the interface (11A).

According to the above, an increase in on resistance of the silicon carbide semiconductor device can be suppressed.

(4) In the silicon carbide semiconductor device of any one of (1) to (3) described above, when a distance from the bottom (21B) of the trench (21) to the second impurity region (17) is expressed as $D_1$, a relation of $0.1\ \mu m \leq D_1 \leq 3.0\ \mu m$ holds.

According to the above, an increase in on resistance can be suppressed, and the possibility of breakage of the gate insulating film upon occurrence of avalanche breakdown can be reduced.

(5) In the silicon carbide semiconductor device of any one of (1) to (4) described above, a width ($W_{Bp1}$) in a lateral direction of the third impurity region (18) is smaller than a width ($W_{Bp2}$) in the lateral direction of the second impurity region (17).

According to the above, avalanche breakdown is more likely to occur in the third impurity region than in the second impurity region. Therefore, the possibility of breakage of the gate insulating film upon occurrence of avalanche breakdown can be reduced.

(6) In the silicon carbide semiconductor device of any one of (1) to (5) described above, the width ($W_{BP2}$) in the lateral direction of the second impurity region (17) is greater than a width (W trench) trench) in the lateral direction of the trench (21).

According to the above, the width in the lateral direction of a depletion layer extending from the second impurity region can be made greater than the width in the lateral direction of the trench. Therefore, the electric field applied to the gate insulating film can be reduced at the bottom of the trench.

(7) In the silicon carbide semiconductor device of any one of (1) to (6) described above, a thickness ($t_{g1}$) of the gate insulating film (25) at the bottom of the trench (21) is greater than a thickness ($t_{g2}$) of a portion of the gate insulating film (25) which is in contact with a sidewall of the trench (21).

According to the above, the possibility of breakage of the gate insulating film can be reduced even when avalanche breakdown occurs at the bottom of the trench.

(8) In the silicon carbide semiconductor device of any one of (1) to (7) described above, the sidewall (21A) of the trench (21) has a crystal plane orientation of <1-100> or <11-20>.

According to the above, the on resistance of the silicon carbide semiconductor device can be reduced.

(9) In the silicon carbide semiconductor device of any one of (1) to (8) described above, the trench (21) has a sidewall surface (21A) inclined relative to a {000-1} plane.

According to the above, the on resistance of the silicon carbide semiconductor device can be reduced.

(10) The silicon carbide semiconductor device of any one of (1) to (9) described above is a MOSFET (Metal Oxide Semiconductor Field Effect Transistor). The silicon carbide substrate (10) has the first conductivity type.

According to the above, a MOSFET having a trench gate can be implemented by the silicon carbide semiconductor device.

(11) The silicon carbide semiconductor device of any one of (1) to (9) described above is an IGBT (Insulated Gate Bipolar Transistor). The silicon carbide substrate (10) has the second conductivity type.

According to the above, an IGBT having a trench gate can be implemented by the silicon carbide semiconductor device.

Details of Embodiment of the Present Disclosure

A MOSFET is illustrated below as an example of a silicon carbide semiconductor device according to an embodiment of the present disclosure.

FIG. 1 is a cross-sectional view showing the structure of a silicon carbide semiconductor device according to one embodiment of the present disclosure. Referring to FIG. 1, a silicon carbide semiconductor device 1 includes a silicon carbide substrate 10, silicon carbide epitaxial layers 11, 12, a gate insulating film 25, a gate electrode 30, an interlayer insulating film 40, a source electrode 50, and a drain electrode 70.

Silicon carbide substrate 10 has main surfaces 10A and 10B. Main surfaces 10A and 10B are located opposite to each other. Silicon carbide epitaxial layer 11 (first silicon carbide layer) is disposed on main surface 10A. Silicon carbide epitaxial layer 12 is disposed on silicon carbide epitaxial layer 11.

Silicon carbide substrate 10 and silicon carbide epitaxial layers 11, 12 have a first conductivity type. The first conductivity type is n type in this embodiment. Silicon carbide substrate 10 and silicon carbide epitaxial layers 11, 12 contain an n type impurity such as N (nitrogen).

Silicon carbide epitaxial layer 12 includes a drift region 13, a body region 14, a source region 15 and a deep region 16 (first impurity region). Drift region 13, body region 14 and source region 15 are each formed as a layer. That is, drift region 13, body region 14 and source region 15 correspond to a second silicon carbide layer, a third silicon carbide layer and a fourth silicon carbide layer, respectively.

Drift region 13 has n type conductivity. An impurity concentration of drift region 13 is substantially equal to an impurity concentration of silicon carbide epitaxial layer 12.

Body region 14 is formed on drift region 13. Body region 14 has a second conductivity type different from the first conductivity type. The second conductivity type is p type in this embodiment. Body region 14 contains a p type impurity such as Al (aluminum) or B (boron).

Source region 15 is formed on body region 14. Source region 15 has n type conductivity. Source region 15 contains an n type impurity such as P (phosphorus). A concentration of the n type impurity contained in source region 15 is higher than the concentration of the n type impurity in drift region 13.

Deep region 16 is in contact with source electrode 50. Deep region 16 extends through source region 15, body region 14 and drift region 13. A bottom 16B of deep region 16 is in contact with an interface 11A between silicon carbide epitaxial layer 11 and silicon carbide epitaxial layer 12.

Deep region 16 has p type conductivity. Deep region 16 contains a p type impurity such as Al (aluminum). A p type impurity concentration of deep region 16 is higher than a p type impurity concentration of body region 14. Deep region 16 is electrically connected to body region 14 and source electrode 50.

A trench 21 is formed in silicon carbide epitaxial layer 12. Trench 21 opens at a main surface 12A of silicon carbide epitaxial layer 12. Main surface 12A is a surface of silicon carbide epitaxial layer 12 which is located opposite to interface 11A.

Trench 21 extends through source region 15 and body region 14 to reach drift region 13. Trench 21 has sidewall surfaces 21A and a bottom 21B. Bottom 21B of trench 21 is not in contact with interface 11A. That is, the depth of deep region 16 is greater than the depth of trench 21 in a depth direction from main surface 12A. The "depth direction" corresponds to a Y direction shown in FIG. 1.

Sidewall surfaces 21A have a crystal plane orientation of <1-100> or <11-20>. When the MOSFET is on, a channel is formed in body region 14 in the vicinity of sidewall surfaces 21A of trench 21. By selecting the aforementioned crystal plane orientation, on resistance of silicon carbide semiconductor device 1 can be reduced.

Gate insulating film 25 is in contact with main surface 12A, and is in contact with sidewall surfaces 21A and bottom 21B of trench 21. A material for gate insulating film 25 is $SiO_2$ (silicon dioxide) in this embodiment.

Gate electrode 30 is in contact with gate insulating film 25, and is disposed within trench 21 so as to fill trench 21. Gate electrode 30 is made of polysilicon doped with an impurity, for example.

Silicon carbide epitaxial layer 11 includes buried regions 17, 18 and 20. Each of buried regions 17, 18 and 20 is in contact with interface 11A.

Buried region 17 (second impurity region) is disposed below bottom 21B of trench 21. Buried region 17 is spaced from bottom 21B of trench 21. Buried region 17 has p type conductivity. Buried region 17 contains a p type impurity such as Al (aluminum). Although not shown in FIG. 1, buried region 17 is electrically connected to buried region 18.

Buried region 18 is in contact with bottom 16B of deep region 16. Buried region 18 has p type conductivity. Buried region 18 contains a p type impurity such as Al (aluminum).

Buried region 18 is electrically connected to deep region 16. Therefore, deep region 16, buried region 17 and buried region 18 are electrically connected together.

Buried region 20 is disposed between buried region 17 and buried region 18 in a lateral direction. The lateral direction is a direction orthogonal to the depth direction, and corresponds to an X direction shown in FIG. 1. Buried region 20 has n type conductivity. Buried region 20 contains an n type impurity such as P (phosphorus).

Interlayer insulating film 40 is made of $SiO_2$ (silicon dioxide), for example, and is disposed on main surface 12A. Interlayer insulating film 40 is in contact with gate insulating film 25 and gate electrode 30. Interlayer insulating film 40 is disposed to surround gate electrode 30, together with gate insulating film 25, to electrically insulate gate electrode 30 from source electrode 50.

Source electrode 50 is in contact with source region 15 and deep region 16. Therefore, source electrode 50 is electrically connected to source region 15 and deep region 16.

Drain electrode 70 is in contact with main surface 10B of silicon carbide substrate 10. Drain electrode 70 is made of a material similar to that for source electrode 50, for example. Drain electrode 70 is electrically connected to silicon carbide substrate 10.

Next, the configuration of silicon carbide semiconductor device 1 will be described in further detail. In the following description, the thickness means a width along the depth direction (Y direction).

An impurity concentration $N_{D1}$ of silicon carbide epitaxial layer 11 is in the range from $1\times10^{14}$ cm$^{-3}$ to $2\times10^{16}$ cm$^{-3}$. A thickness $t_1$ of silicon carbide epitaxial layer 11 is in the range from 3 μm to 150 μm. Preferably, impurity concentration $N_{D1}$ is about $5\times10^{15}$ cm$^{-3}$, and thickness $t_1$ is about 10 μm.

An impurity concentration $N_{D2}$ of silicon carbide epitaxial layer 12 is in the range from $1\times10^{15}$ cm$^{-3}$ to $5\times10^{17}$ cm$^{-3}$. A thickness $t_2$ of silicon carbide epitaxial layer 12 is in the range from 1 μm to 5 μm. Preferably, impurity concentration $N_{D2}$ is about $5\times10^{16}$ cm$^{-3}$, and thickness $t_2$ is about 2 μm. As noted above, impurity concentration $N_{D2}$ of silicon carbide epitaxial layer 12 is substantially equal to the impurity concentration of drift region 13.

The impurity concentration of body region 14 is in the range from $1\times10^{17}$ cm$^{-3}$ to $1\times10^{19}$ cm$^{-3}$. The thickness of body region 14 is in the range from 0.2 μm to 1.5 μm. Preferably, the impurity concentration of body region 14 is about $1\times10^{18}$ cm$^{-3}$, and the thickness of body region 14 is about 0.5 μm.

The impurity concentration of source region 15 is in the range from $5\times10^{18}$ cm$^{-3}$ to $1\times10^{20}$ cm$^{-3}$. The depth of source region 15 from main surface 12A is in the range from 0.1 μm to 0.5 μm. Preferably, the impurity concentration of source region 15 is about $5\times10^{19}$ cm$^{-3}$, and the depth of source region 15 from main surface 12A is about 0.3 μm.

The impurity concentration of deep region 16 is in the range from $1\times10^{19}$ cm$^{-3}$ to $2\times10^{20}$ cm$^{-3}$. The depth of deep region 16 from main surface 12A is in the range from 1.0 μm to 5.0 μm. Preferably, the impurity concentration of deep region 16 is about $1\times10^{20}$ cm$^{-3}$, and the depth of deep region 16 from main surface 12A is about 2.0 μm. It should be noted that the depth of deep region 16 from main surface 12A is substantially equal to thickness $t_2$ of silicon carbide epitaxial layer 12.

Buried region 17 and buried region 18 have a substantially identical impurity concentration $N_{BP}$ and a substantially identical thickness. The thickness of buried regions 17 and 18 corresponds to the depth from interface 11A.

Impurity concentration $N_{BP}$ of buried regions 17 and 18 is in the range from $5\times10^{16}$ cm$^{-3}$ to $5\times10^{19}$ cm$^{-3}$, and a depth $D_{BP}$ of buried regions 17 and 18 from interface 11A is in the range from 0.1 μm to 1.0 μm. Preferably, impurity concentration $N_{BP}$ is about $5\times10^{18}$ cm$^{-3}$, and depth $D_{BP}$ is about 0.4 μm.

$D_1$ denotes a distance in the depth direction from bottom 21B of trench 21 to buried region 17. When distance $D_1$ is less than 0.1 μm, buried region 17 is substantially in contact with bottom 21B of trench 21. The breakdown voltage may thereby be reduced. When distance $D_1$ is set to be greater than 3.0 μm, on the other hand, the effect of relieving electric field concentration to gate insulating film 25 is reduced. Therefore, the range of distance $D_1$ is preferably 0.1 μm≤$D_1$≤3.0 μm.

An impurity concentration $N_J$ of buried region 20 is in the range from $1\times10^{16}$ cm$^{-3}$ to $5\times10^{18}$ cm$^{-3}$, and a depth $D_J$ of buried region 20 from interface 11A is in the range from 0.1 μm to 1.0 μm. Preferably, impurity concentration $N_J$ is about $1\times10^{17}$ cm$^{-3}$, and depth $D_{BP}$ is about 0.2 μm.

A thickness $t_{g1}$ of gate insulating film 25 at bottom 21B of trench 21 is in the range from 50 nm to 500 nm, and is preferably 200 nm. A thickness $t_{g2}$ of gate insulating film 25 at sidewall surface 21A of trench 21 is about 50 nm. Thickness $t_{g1}$ is preferably greater than thickness $t_{g2}$.

A relation of $N_{D1}<N_{D2}<N_J<N_{BP}$ holds among impurity concentrations $N_{D1}$, $N_{D2}$, $N_J$ and $N_{BP}$. A relation of $D_J<D_{BP}$ holds between depth $D_J$ of buried region 20 from interface 11A and depth $D_{BP}$ of buried region 17 from interface 11A.

When the width of bottom 21B of trench 21 is expressed as $W_{trench}$ and the width of buried region 17 is expressed as $W_{BP2}$, a relation of $W_{trench}<W_{BP2}$ holds. Furthermore, when the width of buried region 18 is expressed as $W_BW_{BP1}$, a relation of $W_{BP1}<W_{BP2}$ holds between width $W_{BP1}$ and width $W_{BP2}$. It should be noted that a width $W_J$ of buried region 20 is not particularly limited. Width $W_J$ is set to an appropriate value greater than 0 μm for achieving characteristics (breakdown voltage, resistance value during turn-on, and the like) required of silicon carbide semiconductor device 1.

Next, the operation of silicon carbide semiconductor device 1 will be described. In the following description, a "voltage" means a potential difference with reference to a potential of source electrode 50. The potential of source electrode 50 is set to a ground potential, for example.

FIG. 1 shows an example where silicon carbide semiconductor device 1 is an n type MOSFET. In the case of an n type MOSFET, even if a positive voltage is applied to the drain, the MOSFET is in a non-conducting state when the voltage of gate electrode 30 is less than a threshold voltage.

Figure 2:
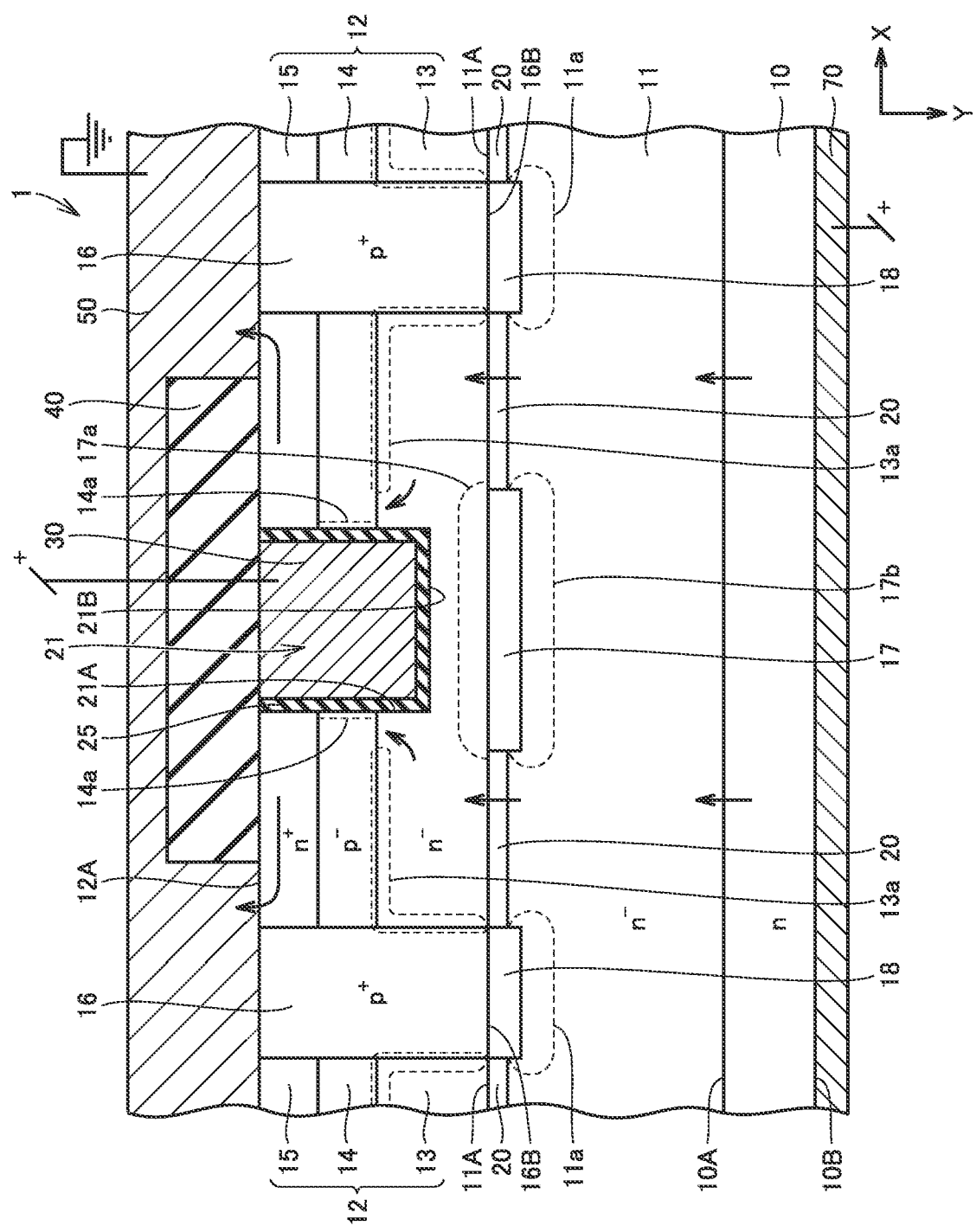

FIG. 2 illustrates operation when silicon carbide semiconductor device 1 according to the embodiment of the present disclosure is on. As shown in FIG. 2, when a voltage equal to or higher than the threshold voltage is applied to gate electrode 30, a channel 14a is formed in body region 14. Since a positive voltage is being applied to drain electrode 70, a current flows from drain electrode 70 toward source electrode 50. As shown by the arrows, the current flows from drain electrode 70 through silicon carbide substrate 10, silicon carbide epitaxial layer 11, buried region 20, drift region 13, channel 14a and source region 15, to source electrode 50.

Buried region 17 is electrically connected to buried region 18, and buried region 18 is electrically connected to deep region 16. Furthermore, deep region 16 is electrically connected to body region 14, and is electrically connected to source electrode 50. Silicon carbide substrate 10, silicon carbide epitaxial layer 11, buried region 20 and drift region 13 are electrically connected together, and have a positive voltage applied thereto.

With the application of a reverse bias voltage between a p type region and an n type region, a depletion layer extends from their junction to each of the p type region and the n type region. The width of the depletion layer in each region depends on the impurity concentration of each of the p type region and the n type region, and the reverse bias voltage. In the following, "the side toward which the depletion layer extends" refers to one of the p type region and the n type region that has a greater width of the depletion layer from the junction.

Body region 14, deep region 16, buried region 17 and buried region 18 have the second conductivity type (p type) and are electrically connected together. Similarly, silicon carbide substrate 10, silicon carbide epitaxial layer 11, buried region 20 and drift region 13 have the first conductivity type (n type) and are electrically connected together.

Depletion layers 11a, 13a, 17a and 17b are formed by the reverse bias voltage. Depletion layer 11a extends from an interface between buried region 18 and silicon carbide epitaxial layer 11 toward silicon carbide epitaxial layer 11. Depletion layer 13a extends from an interface between drift region 13 and body region 14 toward drift region 13. Depletion layer 17a extends from an interface (junction surface) between buried region 17 and drift region 13 toward drift region 13. Depletion layer 17b extends from an interface (junction surface) between buried region 17 and silicon carbide epitaxial layer 11 toward silicon carbide epitaxial layer 11.

Figure 3:
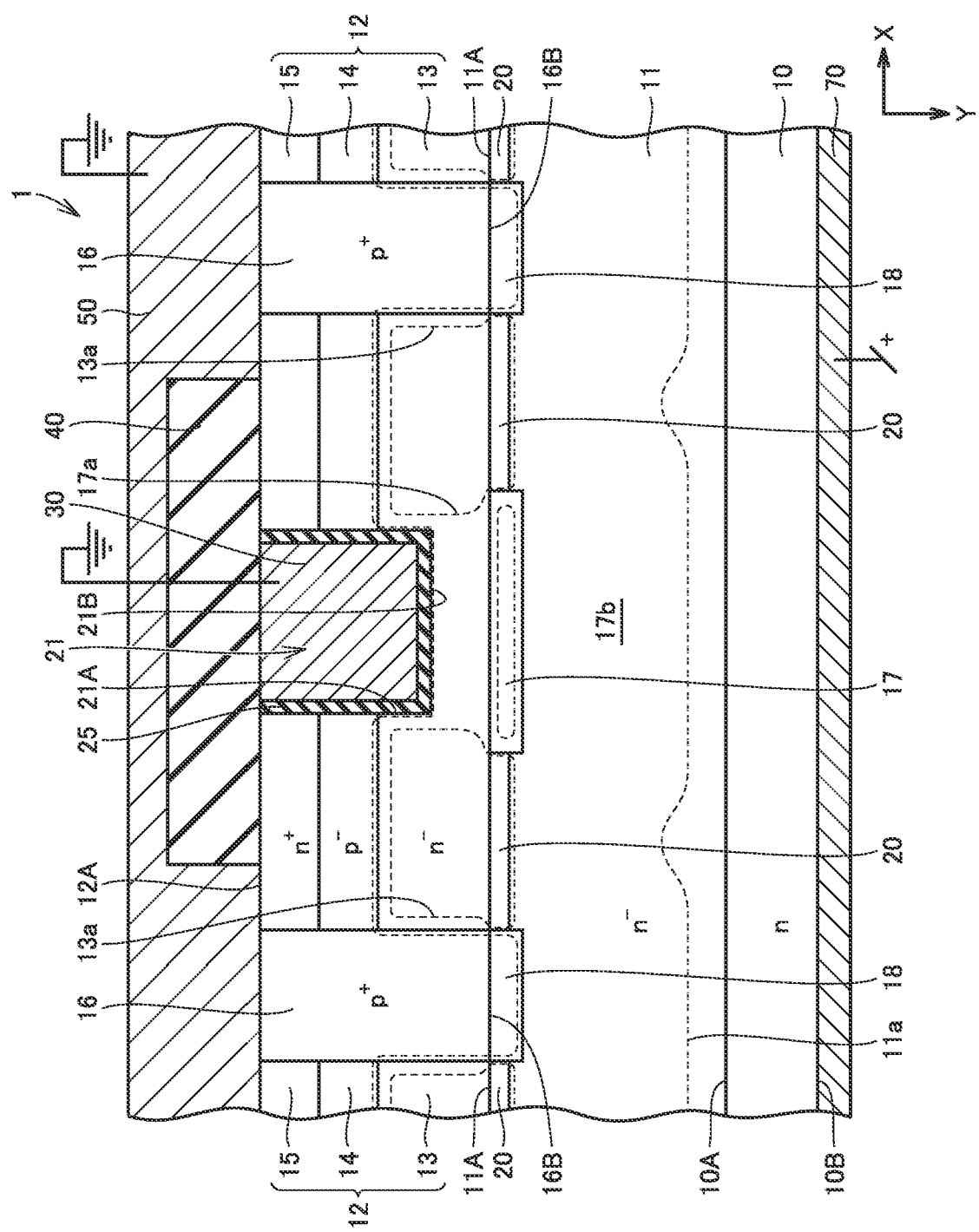
FIG. 3 illustrates an off state of the silicon carbide semiconductor device according to the embodiment of the present disclosure.

FIG. 3 illustrates an off state of silicon carbide semiconductor device 1 according to the embodiment of the present disclosure. Referring to FIG. 3, when silicon carbide semiconductor device 1 (MOSFET) is off, the voltage of gate electrode 30 is equal to or lower than the threshold voltage. The potential of gate electrode 30 is equal to the potential of source electrode 50, for example. That is, the voltage of gate electrode 30 is 0 V.

By switching of silicon carbide semiconductor device 1, a high voltage (for example, 1200 V) may be applied to drain electrode 70 when silicon carbide semiconductor device 1 is off. Depletion layers 17a and 13a both extend toward drift region 13. Accordingly, depletion layers 13a and 17a coalesce as illustrated in FIG. 3. Similarly, depletion layers 11a and 17b extend toward silicon carbide epitaxial layer 11. Depletion layers 11a and 17b thereby coalesce.

The depletion layer formed on the silicon carbide epitaxial layer 11 side can relieve electric field concentration in silicon carbide epitaxial layer 11. In addition, since a region around gate insulating film 25 is depleted in drift region 13, electric field concentration in gate insulating film 25 can be relieved. Accordingly, the possibility of breakage of gate insulating film 25 can be reduced even if avalanche breakdown occurs.

Figure 4:
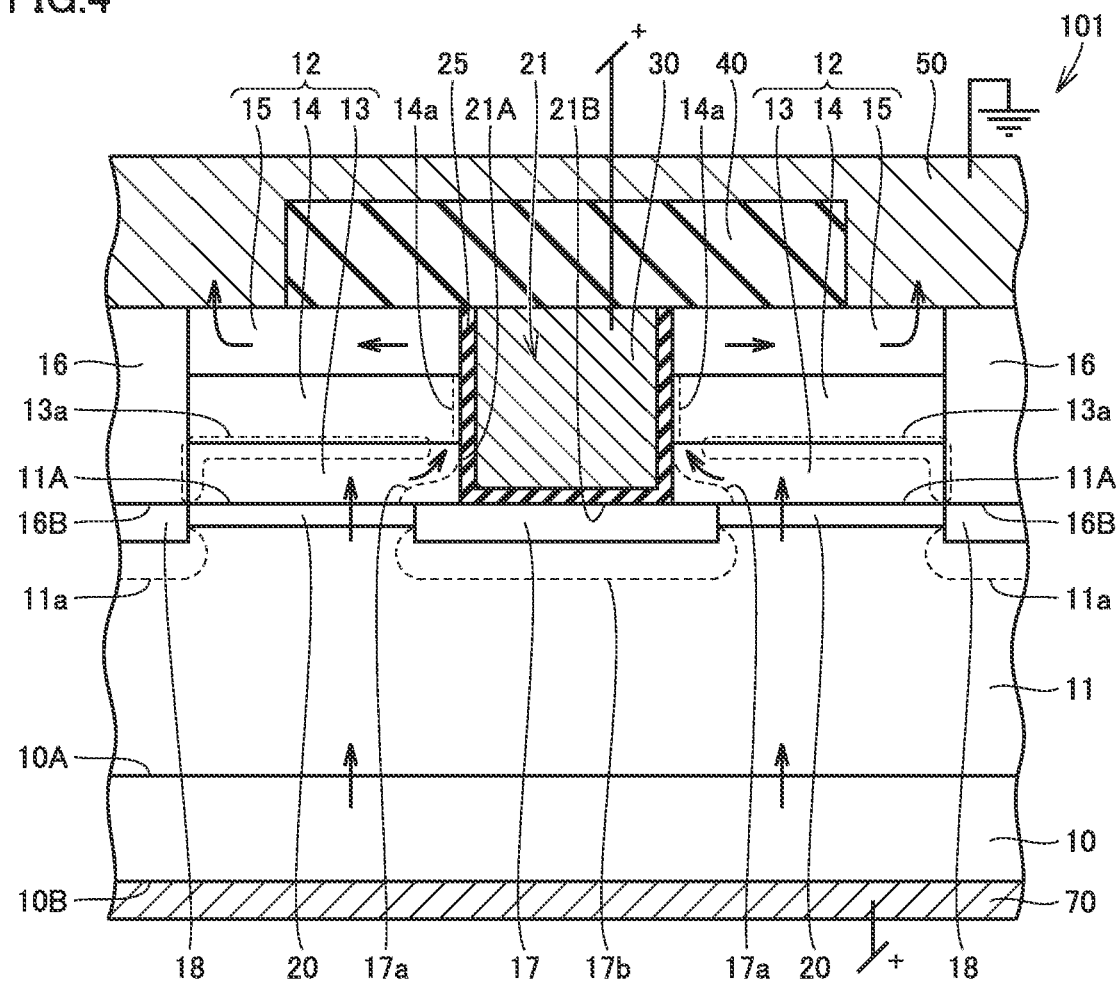
FIG. 4 is a cross-sectional view showing a portion of a comparative example of the silicon carbide semiconductor device according to the embodiment of the present disclosure.

FIG. 4 is a cross-sectional view showing a portion of a comparative example of the silicon carbide semiconductor device according to the embodiment of the present disclosure. Referring to FIG. 4, in a silicon carbide semiconductor device 101, buried region 17 is in contact with bottom 21B of trench 21. During turn-on, a current flows through a non-depleted portion between depletion layer 17a and depletion layer 13a. However, since depletion layers 17a and 13a extend toward drift region 13, a current flow path is narrow in the vicinity of channel 14a. That is, constriction resistance occurs in the vicinity of channel 14a. The high resistance value in the vicinity of channel 14a causes an increase in on resistance.

In contrast, according to the embodiment of the present disclosure, buried region 17 and bottom 21B of trench 21 are spaced from each other. Therefore, depletion layers 17a and 13a both extend toward drift region 13 due to a drain voltage when silicon carbide semiconductor device 1 is on. However, the current path in the vicinity of channel 14a is wider in the embodiment of the present disclosure than in the configuration shown in FIG. 4. The increase in on resistance can thereby be suppressed.

From the viewpoint of suppressing the increase in on resistance, the distance from bottom 21B of trench 21 to buried region 17 ($D_1$ shown in FIG. 1) is preferably at least 0.1 μm. From the viewpoint of suppressing the increase in on resistance, it is preferable to have a greater distance $D_1$. On the other hand, the greater the distance $D_1$, the more likely it is that a voltage exceeding the dielectric withstand voltage of gate insulating film 25 will be applied to gate insulating film 25 when silicon carbide semiconductor device 1 is off. From the viewpoint of suppressing an electric field applied to gate insulating film 25, distance $D_1$ is preferably not more than 3.0 μm. Therefore, distance $D_1$ is preferably 0.1 μm ≤ $D_1$ ≤ 3.0 μm.

Impurity concentration $N_{D2}$ of drift region 13 (silicon carbide epitaxial layer 12) is higher than impurity concentration $N_{ei}$ of silicon carbide epitaxial layer 11 ($N_{D1} < N_{D2}$). Accordingly, the on resistance of silicon carbide semiconductor device 1 can be reduced. Since impurity concentration $N_{BP}$ of buried region 17 is higher than impurity concentration $N_{D2}$, depletion layer 17a extends toward drift region 13 when a high voltage is applied between the drain and the source. A significant increase in electric field applied to gate insulating film 25 can be suppressed by this depletion layer 17a.

Width $W_{BP2}$ of buried region 17 is greater than width $W_{trench}$ of bottom 21B of trench 21 ($W_{BP2} > W_{trench}$). The width of depletion layer 17a can also be thereby made greater than $W_{trench}$, so that the electric field applied to gate insulating film 25 can be reduced at bottom 21B of trench 21. Furthermore, thickness $t_{g1}$ of gate insulating film 25 at bottom 21B of trench 21 is greater than thickness $t_{g2}$ of gate insulating film 25 at sidewall surface 21A of trench 21 ($t_{g2} < t_{g1}$). Accordingly, the electric field applied to gate insulating film 25 upon occurrence of avalanche breakdown can be reduced. Therefore, the possibility of breakage of gate insulating film 25 upon occurrence of avalanche breakdown can be further reduced.

Furthermore, width $W_{BP1}$ of buried region 18 is smaller than width $W_{BP2}$ of buried region 17 ($W_{BP1} < W_{BP2}$). By defining the relation between width $W_{BP1}$ and width $W_{BP2}$ in this manner, avalanche breakdown is more likely to occur in a region immediately below buried region 18 than in a region immediately below buried region 17. When avalanche breakdown occurs in the region immediately below buried region 18, a breakdown current flows via buried region 18 and deep region 16 to source electrode 50. Since the breakdown current does not flow through the bottom of trench 21, the effect of preventing the breakage of gate insulating film 25 can be further increased.

Impurity concentration $N_{BP}$ of buried region 17 is set so as to prevent complete depletion of buried region 17 when a prescribed high voltage (for example, 1200 V) is applied to drain electrode 70, as shown in FIG. 3. Furthermore, the potential of gate electrode 30 is 0 V.

Figure 5:
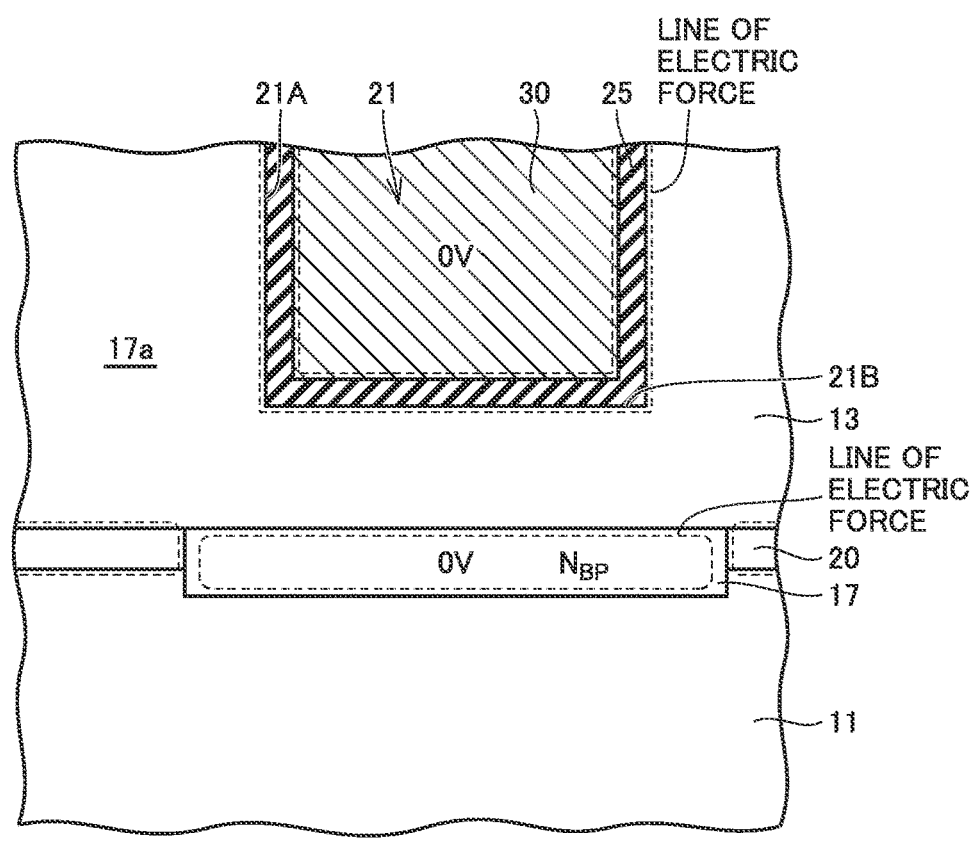
FIG. 5 is a partial enlarged view illustrating a voltage applied in the vicinity of the bottom of a trench when a reverse bias voltage is applied to the silicon carbide semiconductor device according to the embodiment of the present disclosure.

FIG. 5 is a partial enlarged view illustrating a voltage applied in the vicinity of bottom 21B of trench 21 when a reverse bias voltage is applied to the silicon carbide semiconductor device according to the embodiment of the present disclosure. As shown in FIG. 5, the voltage of gate electrode 30 is 0 V when silicon carbide semiconductor device 1 is turned off. A region between bottom 21B of trench 21 and buried region 17 is depleted to form depletion layer 17a. A potential distribution occurs in depletion layer 17a. Buried region 17, on the other hand, includes a non-depleted portion. The potential of this portion is 0 V. Since the voltages of gate electrode 30 and of the non-depleted portion of buried region 17 are 0 V, the slope of electric field strength along the depth direction from gate electrode 30 is decreased. Therefore, the electric field applied to a portion of gate insulating film 25 which is disposed at bottom 21B of trench 21 can be reduced. When buried region 17 is completely depleted, a potential distribution also occurs within buried region 17, so that the slope of electric field strength along the depth direction from gate electrode 30 is increased. Accordingly, the electric field applied to a portion of gate insulating film 25 which is disposed at bottom 21B of trench 21 is increased.

According to the embodiment of the present disclosure, impurity concentration $N_{BP}$ of buried region 17 is higher than impurity concentration $N_{D2}$ of drift region 13 ($N_{D2}<N_{BP}$). Accordingly, buried region 17 is less likely to be completely depleted even when a prescribed high voltage (for example, 1200 V) is applied to drain electrode 70. Therefore, the possibility of breakage of gate insulating film 25 by a high electric field can be reduced.

Furthermore, according to the embodiment of the present disclosure, impurity concentration $N_J$ of buried region 20 is higher than impurity concentration $N_{D2}$ ($N_{D2}<N_J$). Accordingly, the on resistance of silicon carbide semiconductor device 1 can be reduced. Impurity concentration $N_J$ is lower than impurity concentration $N_{BP}$ of buried region 17 ($N_J<N_{BP}$). Accordingly, the depletion layer extends from a junction surface between buried region 17 and buried region 20 toward buried region 20, so that buried region 17 is less likely to be completely depleted.

Figure 6:
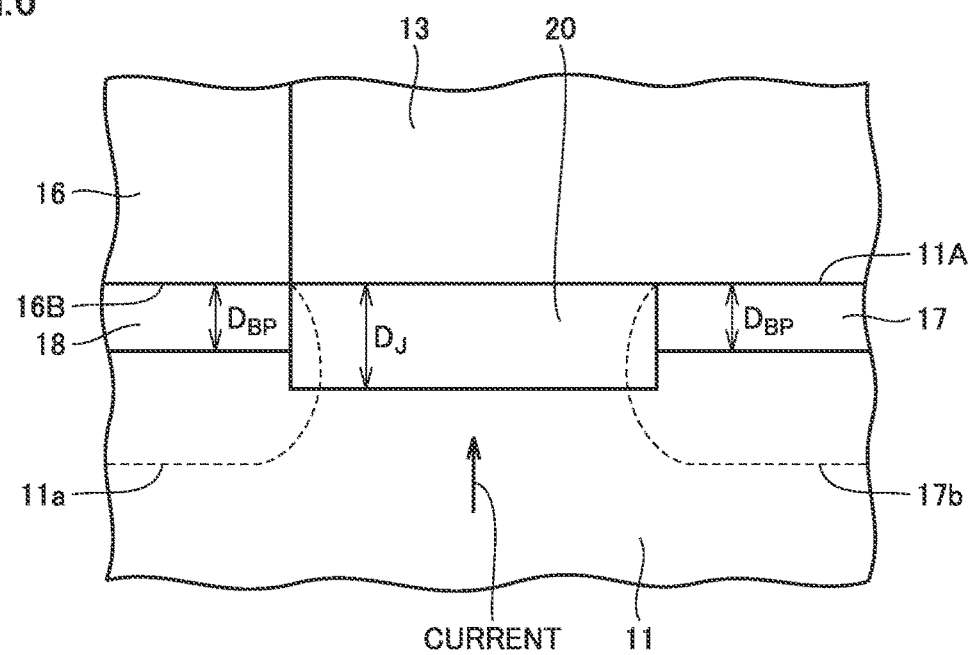
FIG. 6 is a partial enlarged view illustrating a configuration of the comparative example of the silicon carbide semiconductor device according to the embodiment of the present disclosure.

FIG. 6 is a partial enlarged view illustrating a configuration of the comparative example of the silicon carbide semiconductor device according to the embodiment of the present disclosure. As shown in FIG. 6, depletion layers 11a and 17b extend toward silicon carbide epitaxial layer 11. The arrow represents a current flowing in silicon carbide epitaxial layer 11. When $D_J>D_{BP}$ holds, a current flow path becomes narrower, resulting in a higher resistance value. As a result, the silicon carbide semiconductor device has high on resistance.

Figure 7:
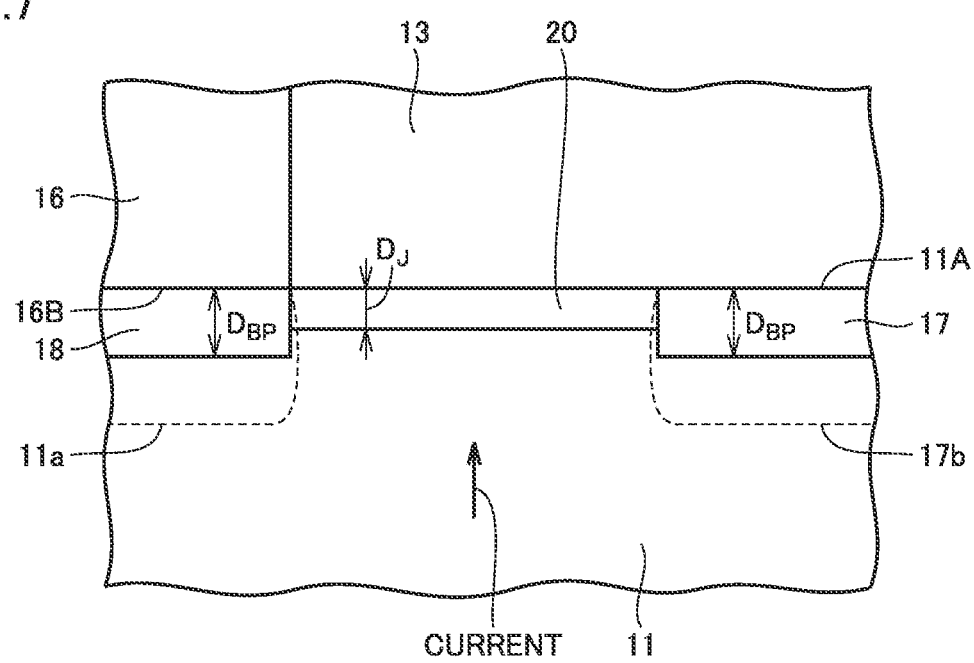

In the embodiment of the present disclosure, on the other hand, depth $D_J$ of buried region 20 from interface 11A is smaller than depth $D_{BP}$ of each of buried regions 17 and 18 from interface 11A ($D_J<D_{BP}$). FIG. 7 is a partial enlarged view illustrating a current which flows when the silicon carbide semiconductor device according to the embodiment of the present disclosure is on. As shown in FIG. 7, when $D_J<D_{BP}$ holds, the current flow path is wide even if depletion layers 11a and 17b extend toward silicon carbide epitaxial layer 11. Therefore, an increase in on resistance of silicon carbide semiconductor device 1 can be suppressed.

Figure 8:
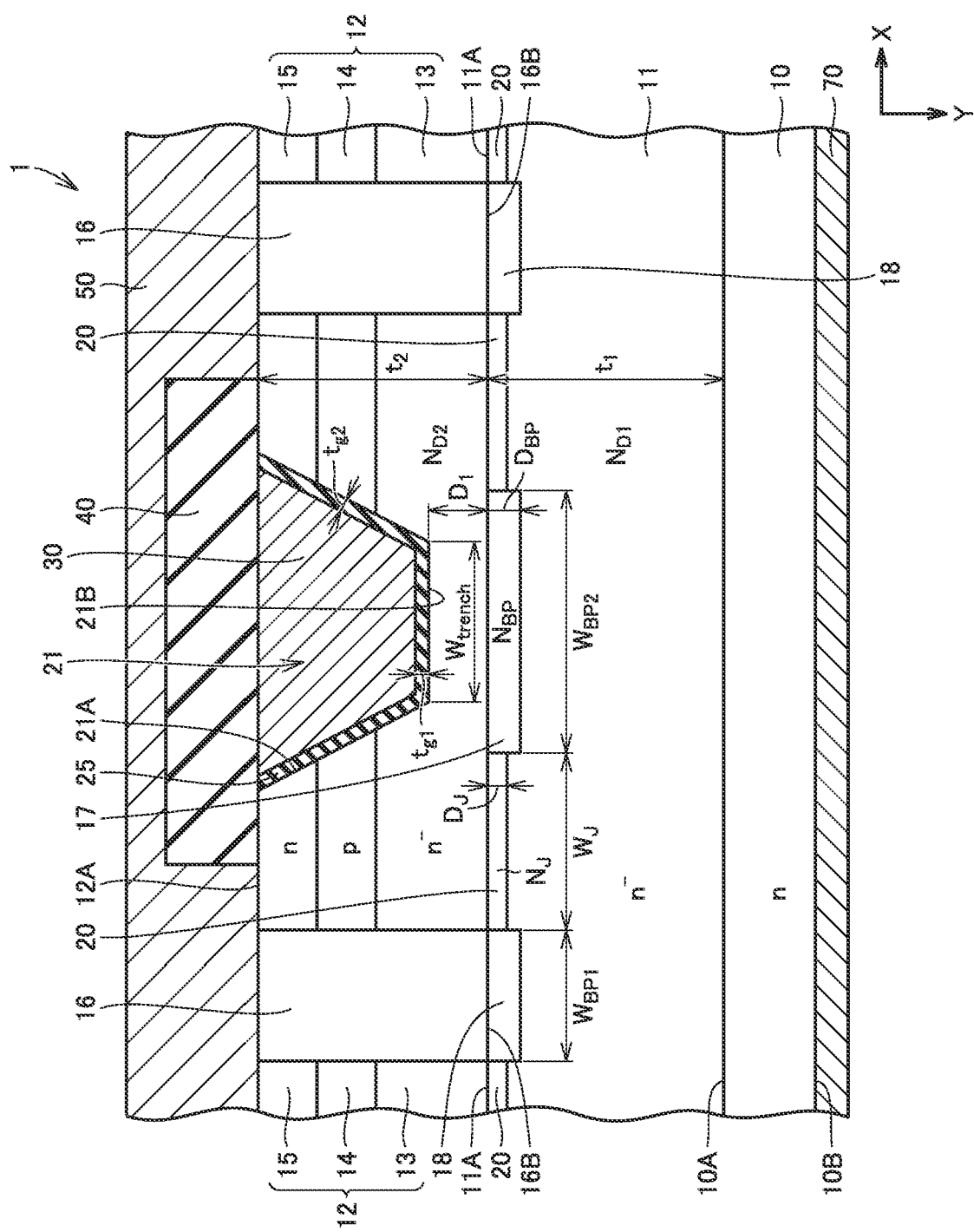
FIG. 8 is a cross-sectional view showing an example of another configuration of the silicon carbide semiconductor device according to the embodiment of the present disclosure.

In the embodiment of the present disclosure, the shape of trench 21 is not limited to the shape shown in FIG. 1 and the like. FIG. 8 is a cross-sectional view showing an example of another configuration of the silicon carbide semiconductor device according to the embodiment of the present disclosure. As shown in FIG. 8, two sidewall surfaces 21A facing each other are inclined relative to main surface 12A.

Sidewall surfaces 21A are surfaces inclined at not less than 50 degrees and not more than 80 degrees relative to the {000-1} plane, for example. More specifically, sidewall surfaces 21A may macroscopically have one of the plane orientations of {0-33-8}, {0-11-2}, {0-11-4} and {0-11-1}. The term "macroscopic" means disregarding a fine structure having a size of approximately interatomic spacing. For measurement of such a macroscopic off angle, a method employing general X-ray diffraction can be used, for example. By employing the above-described plane, the on resistance of silicon carbide semiconductor device 1 can be further reduced.

Figure 9:
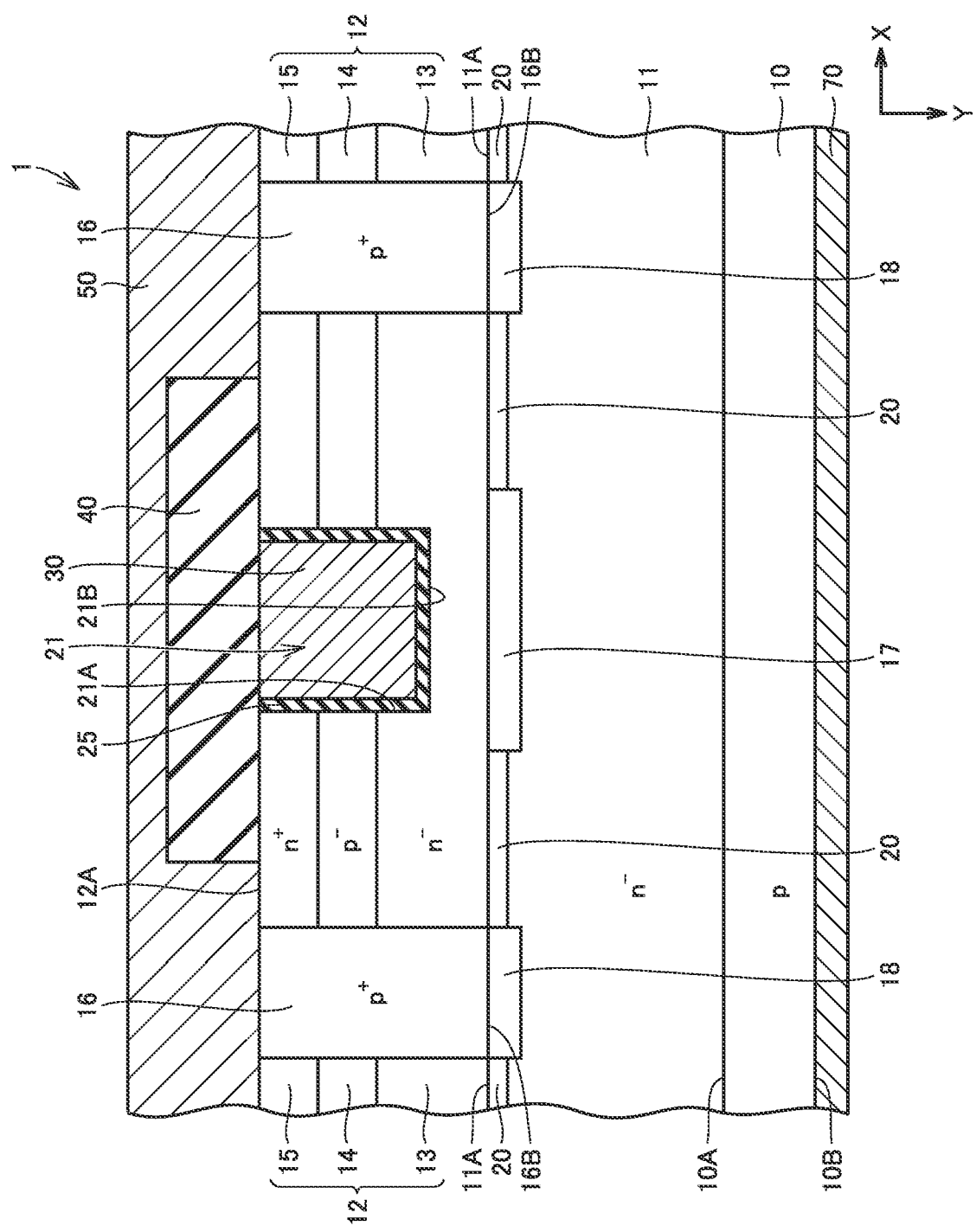
FIG. 9 is a cross-sectional view showing an example of yet another configuration of the silicon carbide semiconductor device according to the embodiment of the present disclosure.

Furthermore, silicon carbide semiconductor device 1 according to the embodiment of the present disclosure is not limited to be a MOSFET. FIG. 9 is a cross-sectional view showing an example of yet another configuration of the silicon carbide semiconductor device according to the embodiment of the present disclosure. As shown in FIG. 9, silicon carbide semiconductor device 1 according to the embodiment of the present disclosure may be an IGBT. According to the configuration shown in FIG. 9, silicon carbide substrate 10 has p type conductivity. In this respect, the IGBT shown in FIG. 9 is different from the MOSFET shown in FIG. 1.

Figure 10:
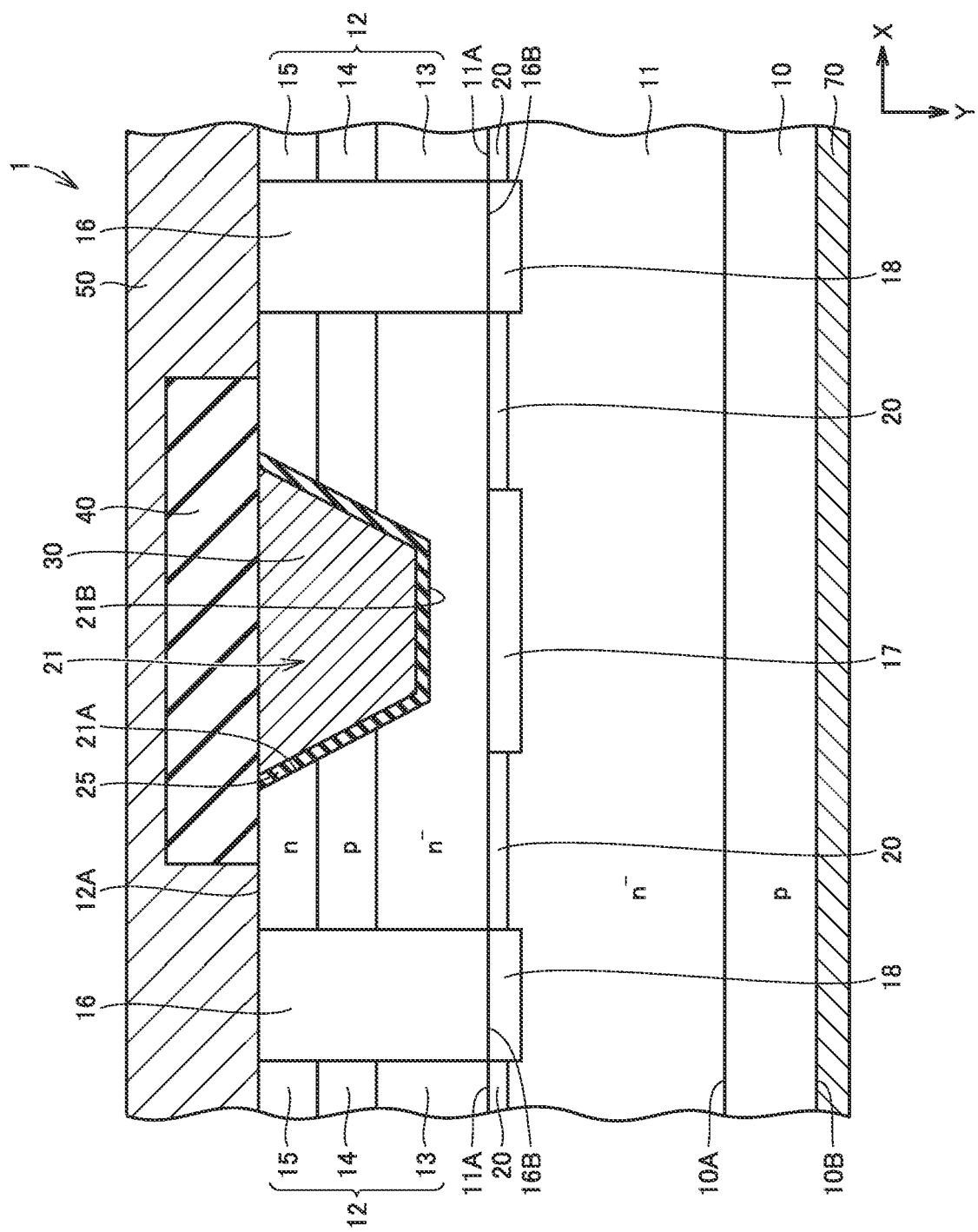
FIG. 10 shows a variation of an IGBT shown in FIG. 9.

When silicon carbide semiconductor device 1 is an IGBT, the shape of trench 21 is again not particularly limited. FIG. 10 shows a variation of the IGBT shown in FIG. 9. As can be seen from a comparison between FIGS. 8 and 10, trench 21 of the IGBT is formed to expand toward main surface 12A in a tapered shape, and may have two sidewall surfaces 21A facing each other. Two sidewall surfaces 21A are surfaces inclined at not less than 50 degrees and not more than 80 degrees relative to the {000-1} plane, for example, and may have one of the aforementioned plane orientations of {0-33-8}, {0-11-2}, {0-11-4} and {0-11-1}.

Although the first conductivity type is n type and the second conductivity type is p type in the above description, the first conductivity type may be p type and the second conductivity type may be n type.

It should be understood that the embodiments disclosed herein are illustrative and non-restrictive in every respect. The scope of the present disclosure is defined by the terms of the claims, rather than the embodiments above, and is intended to include any modifications within the scope and meaning equivalent to the terms of the claims.

REFERENCE SIGNS LIST 1, 101 silicon carbide semiconductor device; 10 silicon carbide substrate; 10A, 10B, 12A main surface; 11, 12 silicon carbide epitaxial layer; 11A interface; 11a, 13a, 17a, 17b depletion layer; 13 drift region; 14 body region; 14a channel; 15 source region; 16 deep region; 16B bottom (deep region); 17, 18, 20 buried region; 21 trench; 21A sidewall surface; 21B bottom (trench); 25 gate insulating film; 30 gate electrode; 40 interlayer insulating film; 50 source electrode; 70 drain electrode; $D_1$ distance; $D_{BP}$, $D_J$ depth; $N_{BP}$, $N_{D1}$, $N_{D2}$, $N_J$ impurity concentration; $W_{BP1}$, $W_{BP2}$, $W_J$, $W_{trench}$ width; $t_1$, $t_2$, $t_{g1}$, $t_{g2}$ thickness.

The invention claimed is:
1. A silicon carbide semiconductor device comprising:
a silicon carbide substrate;
a first silicon carbide layer disposed on the silicon carbide substrate and having a first conductivity type;

a second silicon carbide layer disposed on the first silicon carbide layer and having the first conductivity type;
a third silicon carbide layer disposed on the second silicon carbide layer and having a second conductivity type different from the first conductivity type;
a fourth silicon carbide layer disposed on the third silicon carbide layer and having the first conductivity type; and
a first impurity region formed to extend through the second silicon carbide layer, the third silicon carbide layer and the fourth silicon carbide layer, and having the second conductivity type,
a trench being formed in the silicon carbide semiconductor device so as to extend through the fourth silicon carbide layer and the third silicon carbide layer to reach the second silicon carbide layer,
the silicon carbide semiconductor device comprising:
a gate insulating film in contact with a wall of the trench;
a gate electrode in contact with the gate insulating film and filling the trench;
a second impurity region disposed below the trench while being spaced from a bottom of the trench, and having the second conductivity type;
a third impurity region formed below the first impurity region so as to be in contact with the first impurity region, having the second conductivity type, and electrically connected to the second impurity region; and
a fourth impurity region formed between the second impurity region and the third impurity region and having the first conductivity type,
wherein
a depth of the fourth impurity region from an interface between the first silicon carbide layer and the second silicon carbide layer is smaller than a depth of the second impurity region from the interface.

2. The silicon carbide semiconductor device according to claim 1, wherein
an impurity concentration of the second silicon carbide layer is higher than an impurity concentration of the first silicon carbide layer,
an impurity concentration of the fourth impurity region is higher than the impurity concentration of the second silicon carbide layer, and
an impurity concentration of the second impurity region is higher than the impurity concentration of the fourth impurity region.

3. The silicon carbide semiconductor device according to claim 1, wherein
when a distance from the bottom of the trench to the second impurity region is expressed as $D_1$, a relation of $$0.1 \ \mu m \leq D_1 \leq 3.0 \ \mu m$$

holds.

4. The silicon carbide semiconductor device according to claim 1, wherein
a width in a lateral direction of the third impurity region is smaller than a width in the lateral direction of the second impurity region.

5. The silicon carbide semiconductor device according to claim 1, wherein
the width in the lateral direction of the second impurity region is greater than a width in the lateral direction of the trench.

6. The silicon carbide semiconductor device according to claim 1, wherein a thickness of the gate insulating film at the bottom of the trench is greater than a thickness of a portion of the gate insulating film which is in contact with a sidewall of the trench.

7. The silicon carbide semiconductor device according to claim 1, wherein
the sidewall of the trench has a crystal plane orientation of <1-100> or <11-20>.

8. The silicon carbide semiconductor device according to claim 1, wherein
the trench has a sidewall surface inclined relative to a {000-1} plane.

9. The silicon carbide semiconductor device according to claim 1, wherein
the silicon carbide semiconductor device is a MOSFET, and
the silicon carbide substrate has the first conductivity type.

10. The silicon carbide semiconductor device according to claim 1, wherein
the silicon carbide semiconductor device is an IGBT, and
the silicon carbide substrate has the second conductivity type.

11. A silicon carbide semiconductor device comprising:
a silicon carbide substrate;
a first silicon carbide layer disposed on the silicon carbide substrate and having a first conductivity type;
a second silicon carbide layer disposed on the first silicon carbide layer and having the first conductivity type;
a third silicon carbide layer disposed on the second silicon carbide layer and having a second conductivity type different from the first conductivity type;
a fourth silicon carbide layer disposed on the third silicon carbide layer and having the first conductivity type; and
a first impurity region formed to extend through the second silicon carbide layer, the third silicon carbide layer and the fourth silicon carbide layer, and having the second conductivity type,
a trench being formed in the silicon carbide semiconductor device so as to extend through the fourth silicon carbide layer and the third silicon carbide layer to reach the second silicon carbide layer,
the silicon carbide semiconductor device comprising:
a gate insulating film in contact with a wall of the trench;
a gate electrode in contact with the gate insulating film and filling the trench;
a second impurity region disposed below the trench while being spaced from a bottom of the trench, and having the second conductivity type;
a third impurity region formed below the first impurity region so as to be in contact with the first impurity region, having the second conductivity type, and electrically connected to the second impurity region; and
a fourth impurity region formed between the second impurity region and the third impurity region and having the first conductivity type,
wherein
an impurity concentration of the second silicon carbide layer is higher than an impurity concentration of the first silicon carbide layer,
an impurity concentration of the fourth impurity region is higher than the impurity concentration of the second silicon carbide layer,
an impurity concentration of the second impurity region is higher than the impurity concentration of the fourth impurity region, a depth of the fourth impurity region from an interface between the first silicon carbide layer and the second silicon carbide layer is smaller than a depth of the second impurity region from the interface, and when a distance from the bottom of the trench to the second impurity region is expressed as $D_1$, a relation of $$0.1 \text{ μm} \leq D_1 \leq 3.0 \text{ μm}$$

holds.

12. The silicon carbide semiconductor device according to claim 11, wherein
a thickness of the gate insulating film at the bottom of the trench is greater than a thickness of a portion of the gate insulating film which is in contact with a sidewall of the trench.

13. The silicon carbide semiconductor device according to claim 11, wherein
the sidewall of the trench has a crystal plane orientation of <1-100> or <11-20>.

14. The silicon carbide semiconductor device according to claim 11, wherein
the trench has a sidewall surface inclined relative to a {000-1} plane.

15. A silicon carbide semiconductor device comprising:
a silicon carbide substrate;
a first silicon carbide layer disposed on the silicon carbide substrate and having a first conductivity type;
a second silicon carbide layer disposed on the first silicon carbide layer and having the first conductivity type;
a third silicon carbide layer disposed on the second silicon carbide layer and having a second conductivity type different from the first conductivity type;
a fourth silicon carbide layer disposed on the third silicon carbide layer and having the first conductivity type; and
a first impurity region formed to extend through the second silicon carbide layer, the third silicon carbide layer and the fourth silicon carbide layer, and having the second conductivity type,
a trench being formed in the silicon carbide semiconductor device so as to extend through the fourth silicon carbide layer and the third silicon carbide layer to reach the second silicon carbide layer,
the silicon carbide semiconductor device comprising:
a gate insulating film in contact with a wall of the trench;
a gate electrode in contact with the gate insulating film and filling the trench;
a second impurity region disposed below the trench while being spaced from a bottom of the trench, and having the second conductivity type;
a third impurity region formed below the first impurity region so as to be in contact with the first impurity region, having the second conductivity type, and electrically connected to the second impurity region; and
a fourth impurity region formed between the second impurity region and the third impurity region and having the first conductivity type,
wherein
an impurity concentration of the second silicon carbide layer is higher than an impurity concentration of the first silicon carbide layer,
an impurity concentration of the fourth impurity region is higher than the impurity concentration of the second silicon carbide layer,
an impurity concentration of the second impurity region is higher than the impurity concentration of the fourth impurity region,
a depth of the fourth impurity region from an interface between the first silicon carbide layer and the second silicon carbide layer is smaller than a depth of the second impurity region from the interface,
when a distance from the bottom of the trench to the second impurity region is expressed as $D_1$, a relation of $$0.1 \text{ μm} \leq D_1 \leq 3.0 \text{ μm}$$

holds,
a width in a lateral direction of the third impurity region is smaller than a width in the lateral direction of the second impurity region, and
the width in the lateral direction of the second impurity region is greater than a width in the lateral direction of the trench.

16. The silicon carbide semiconductor device according to claim 15, wherein
a thickness of the gate insulating film at the bottom of the trench is greater than a thickness of a portion of the gate insulating film which is in contact with a sidewall of the trench.

17. The silicon carbide semiconductor device according to claim 15, wherein
the sidewall of the trench has a crystal plane orientation of <1-100> or <11-20>.

18. The silicon carbide semiconductor device according to claim 15, wherein
the trench has a sidewall surface inclined relative to a {000-1} plane.

* * * * *